United States Patent
Cho et al.

(10) Patent No.: US 8,114,216 B2
(45) Date of Patent: Feb. 14, 2012

(54) SEMICONDUCTOR SINGLE CRYSTAL GROWTH METHOD HAVING IMPROVEMENT IN OXYGEN CONCENTRATION CHARACTERISTICS

(75) Inventors: Hyon-Jong Cho, Gumi-si (KR); Seung-Ho Shin, Seoul (KR); Ji-Hun Moon, Gumi-si (KR); Hong-Woo Lee, Gumi-si (KR); Young-Ho Hong, Gumi-si (KR)

(73) Assignee: Siltron, Inc., Gumi (KR)

( * ) Notice: Subject to any disclaimer, the term of this patent is extended or adjusted under 35 U.S.C. 154(b) by 572 days.

(21) Appl. No.: 12/263,000

(22) Filed: Oct. 31, 2008

(65) Prior Publication Data

US 2009/0114147 A1 May 7, 2009

(30) Foreign Application Priority Data

Nov. 2, 2007 (KR) .................. 10-2007-0111339

(51) Int. Cl.
 *C30B 15/00* (2006.01)
(52) U.S. Cl. .............. 117/32; 117/35; 117/932
(58) Field of Classification Search .......... 117/32, 117/35, 932
 See application file for complete search history.

(56) References Cited

U.S. PATENT DOCUMENTS

| | | | | |
|---|---|---|---|---|
| 5,882,398 A | * | 3/1999 | Sonokawa et al. | 117/32 |
| 5,980,630 A | * | 11/1999 | Iino | 117/32 |
| 6,592,662 B2 | * | 7/2003 | Fusegawa et al. | 117/13 |
| 2002/0157600 A1 | * | 10/2002 | Fusegawa et al. | 117/30 |
| 2007/0022942 A1 | * | 2/2007 | Cho | 117/30 |
| 2007/0022943 A1 | * | 2/2007 | Hong et al. | 117/30 |
| 2009/0249996 A1 | * | 10/2009 | Watanabe | 117/32 |
| 2010/0126410 A1 | * | 5/2010 | Fu et al. | 117/32 |

FOREIGN PATENT DOCUMENTS

| | | | |
|---|---|---|---|
| EP | 466457 | * | 1/1992 |
| EP | 0 745 706 | | 12/1996 |
| EP | 1 087 040 | | 3/2001 |
| EP | 1 193 333 | | 4/2002 |
| EP | 1 811 065 | | 7/2007 |
| JP | 9-235192 | | 9/1997 |
| JP | A 9-235192 | | 9/1997 |
| JP | 2004-196569 | | 7/2004 |
| TW | 554093 B | | 9/2003 |

OTHER PUBLICATIONS

Peoples Republic of China Office Action (with English translation) dated Sep. 21, 2011 for Application Serial No. 200810175533.8 filed Nov. 3, 2008.

* cited by examiner

*Primary Examiner* — Karl Group

(74) *Attorney, Agent, or Firm* — Greer, Burns & Crain, Ltd.

(57) ABSTRACT

The present invention relates to a semiconductor single crystal growth method, which uses a Czochralski process for growing a semiconductor single crystal through a solid-liquid interface by dipping a seed into a semiconductor melt received in a quartz crucible and pulling up the seed while rotating the quartz crucible and applying a strong horizontal magnetic field, wherein the seed is pulled up while the quartz crucible is rotated with a rate between 0.6 rpm and 1.5 rpm.

4 Claims, 4 Drawing Sheets

SEMICONDUCTOR SINGLE CRYSTAL GROWTH METHOD HAVING IMPROVEMENT IN OXYGEN CONCENTRATION CHARACTERISTICS

FIELD OF THE INVENTION

The present invention relates to a semiconductor single crystal growth method, which grows a high-quality semiconductor single crystal by controlling the concentration of oxygen inflowed into a semiconductor single crystal during growth of the semiconductor single crystal by a Czochralski process using a strong horizontal magnetic field.

BACKGROUND OF THE INVENTION

In growth of a silicon single crystal by a Czochralski process, a quartz crucible is required to receive a silicon melt melted by a heater. However, the quartz crucible reacts with the silicon melt and is dissolved in the melt. Consequently, oxygen is eluted from the crucible and inflowed into a single crystal through a solid-liquid interface. The oxygen inflowed into the single crystal increases the strength of a wafer and creates a bulk micro defect (BMD) in the wafer, which acts as a gettering site of metal impurities during a semiconductor process and causes various crystal defects and segregation, thereby reducing yield of semiconductor devices. Therefore, during growth of a silicon single crystal by a Czochralski process, concentration of oxygen inflowed into a single crystal through a solid-liquid interface should be appropriately controlled.

Conventionally, a crucible rotation rate, an amount of argon (Ar) gas inflow or pressure was controlled for oxygen concentration control. And, conditions of a cusp magnetic field were changed to vary oxygen concentration while little degrading the crystal defect level. Further, it has been reported that oxygen concentration is influenced by a crucible rotation rate under the conditions of a strong horizontal magnetic field by use of a superconductive horizontal magnet.

As a technique related to oxygen concentration control, Japanese Laid-open Patent Publication No. 9-235192 discloses control of rotation rate of a crucible and a single crystal to a predetermined range when pulling up a silicon single crystal by MCZ (Magnetic Field Applied Czochralski Method) so as to reduce oxygen concentration and oxygen concentration deviation in a radial direction. According to this technique, for a small-diameter silicon single crystal of about 6 inch diameter, level of oxygen concentration deviation in a radial direction can reach up to ±0.5 ppma. However, for a large-diameter silicon single crystal of about 12 inch diameter, level of oxygen concentration deviation in a radial direction may be deteriorated.

As another example, Korean Patent No. 735902 teaches a technique that controls a crucible rotation rate and additionally controls an amount of argon (Ar) gas inflow and pressure so as to effectively control the oxygen concentration according to length of a single crystal under the conditions of a strong horizontal magnetic field. However, this technique is suitable to control the oxygen concentration of a small-diameter silicon single crystal of about 8 inch diameter.

The conventional technique for controlling the oxygen concentration by application of a strong horizontal magnet field mainly intends to grow a single crystal of 8 inch diameter or less using a crucible of 24 inch diameter or less containing a small volume of silicon melt. If the above-mentioned technique is used to grow a single crystal of 12 inch diameter or more using a crucible of 32 inch diameter, oxygen concentration control may fail. This is because an increase of 80% or more in volume of a silicon melt results in an unsteady flow of the melt. That is, as volume of a melt is larger, flow of the melt is unsteadier, and consequently oxygen behavior becomes complicated. Thus, simply changing an amount of argon gas inflow or pressure according to length of a single crystal (volume of a melt) does not lead to a proper control of oxygen concentration. Meanwhile, disorder occurs to oxygen behavior under the conditions of a strong horizontal magnetic field. A scheme should fundamentally solve the disorder problem and improve the width of change in pulling speed caused by a severely unsteady flow of a melt.

As length of an ingot is larger, a contact area between a melt and a crucible reduces. To overcome the reduction effect, the conventional technique increased gradually a crucible rotation rate (set a crucible rotation rate in the range between 0.1 rpm and 0.9 rpm or between 0.3 rpm and 0.7 rpm). In this case, as shown in FIG. 1, oxygen concentration reduces according to probability at an intermediate stage of a body of an ingot. In FIG. 1, a section between upper and lower horizontal reference lines (as indicated by one-dotted chain lines) means a preferable oxygen concentration range. Application of the above-mentioned crucible rotation rate results in oxygen concentration of 11 ppma or more for a single crystal of 8 inch diameter or less, however it results in a very unsteady oxygen concentration profile for a single crystal of 12 inch diameter or more because the large-diameter single crystal uses a large volume of melt.

And, in the case that an amount of argon gas inflow and pressure are controlled according to the above-mentioned technique so as to control the oxygen concentration (an amount of argon gas inflow is decreased from 160 lpm to 140 lpm, and pressure is increased from 50 Torr to 60~70 Torr), oxygen concentration reduces at an intermediate stage of a body of an ingot as shown in FIG. 2.

Analysis tells that the above-mentioned phenomenon is resulted from split of a melt into a low oxygen melt and a high oxygen melt under the conditions of a strong horizontal magnetic field. That is, according to a Czochralski process not using a magnetic field or a cusp or vertical MCZ having a rotational symmetry, rotational symmetry can be maintained by rotation of a single crystal and a crucible, and thus a melt is not split into two type melts. However, according to a horizontal MCZ having a mirror symmetry, Lorentz force is generated in the opposite (right and left) direction due to rotation of a single crystal and a crucible, and thus a melt is split into two types of melts. On this condition, the behavior of oxygen inflowed into a single crystal is influenced according to how a low oxygen melt and a high oxygen melt govern a lower portion of an interface of the single crystal. For example, for a 3rd Run of FIG. 1, a high oxygen melt is dominant in ingot length between 800 mm and 900 mm and a low oxygen melt is dominant in ingot length between 1000 mm and 1300 mm. It was found that the type of a dominant melt is influenced by a crucible rotation rate. The frequency of a low oxygen melt is 0.005 Hz, which corresponds to a crucible rotation rate of about 0.3 rpm. Therefore, when a crucible rotation rate is about 0.3 rpm, a resonance phenomenon with a low oxygen melt occurs, which makes it difficult to grow a crystal of high oxygen.

SUMMARY OF THE INVENTION

The present invention is designed to solve the above-mentioned problems. Therefore, it is an object of the present invention to provide a semiconductor single crystal growth method that suggests crucible rotation conditions capable of controlling the oxygen concentration to reduce the oxygen concentration deviation in a prime length during growth of a large-diameter single crystal of, for example, 12 inch diameter.

It is another object of the present invention to provide a semiconductor single crystal growth method that improves the width of change in pulling speed during growth of a large-diameter single crystal of, for example, 12 inch diameter, thereby ensuring process stability.

In order to achieve the object of the present invention, the present invention provides a semiconductor single crystal growth method, which uses a Czochralski process for growing a semiconductor single crystal through a solid-liquid interface by dipping a seed into a semiconductor melt received in a quartz crucible and pulling up the seed while rotating the quartz crucible and applying a strong horizontal magnetic field, wherein the seed is pulled up while the quartz crucible is rotated with a rate between 0.6 rpm and 1.5 rpm.

Preferably, the quartz crucible is rotated with a rate between 0.6 rpm and 0.8 rpm at an initial stage of a body of the semiconductor single crystal.

Preferably, a rotation rate of the quartz crucible is gradually increased to minimize a width of change in oxygen concentration according to single crystal growth length.

The strong horizontal magnetic field may be applied with an intensity of 2000 G or more.

The strong horizontal magnetic field may be applied with an intensity between 2500 G and 3500 G.

BRIEF DESCRIPTION OF THE DRAWINGS

The present invention will be more fully described in the following detailed description, taken accompanying drawings, however, the description proposed herein is just a preferable example for the purpose of illustrations, not intended to limit the scope of the invention.

DETAILED DESCRIPTION OF THE INVENTION

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

The present invention performs a semiconductor single crystal growth method by a Czochralski process that grows a semiconductor single crystal through a solid-liquid interface by dipping a seed into a semiconductor melt received in a quartz crucible and pulling up the seed while rotating the quartz crucible and applying a strong horizontal magnetic field of 2000 G or more, and in particular, pulls up the seed while rotating the quartz crucible with a rate between 0.6 rpm and 1.5 rpm. Here, it is preferable to apply the strong horizontal magnetic field with an intensity between 2500 G and 3500 G in consideration of optimum temperature distribution in the melt and oxygen dissolution from the Q'z glass crucible.

Figure 1:
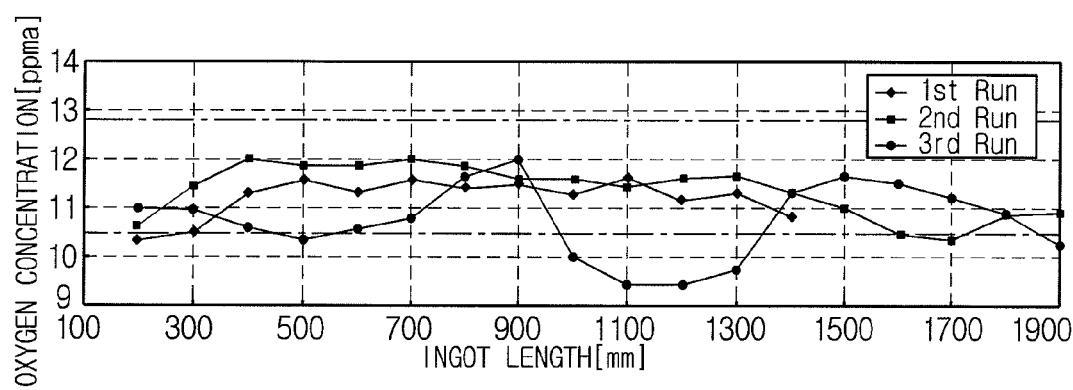
FIGS. 1 and 2 are graphs of oxygen concentration profile according to ingot length, provided by a conventional silicon single crystal growth method.
Figure 2:
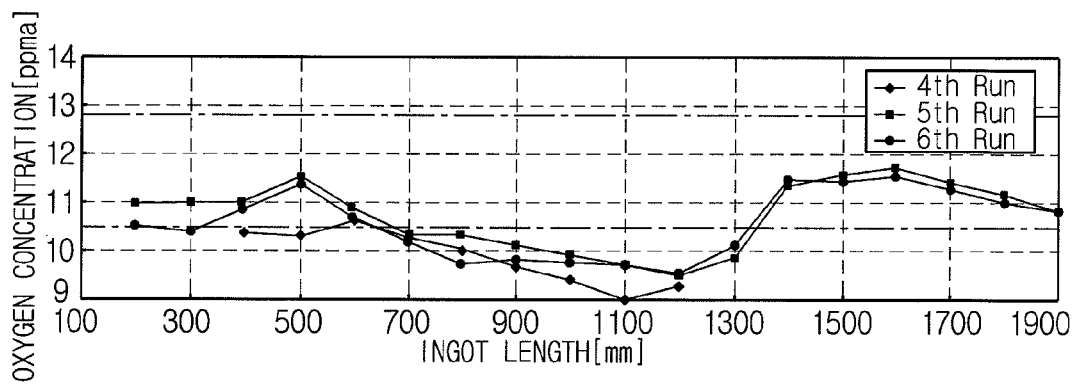
Figure 3:
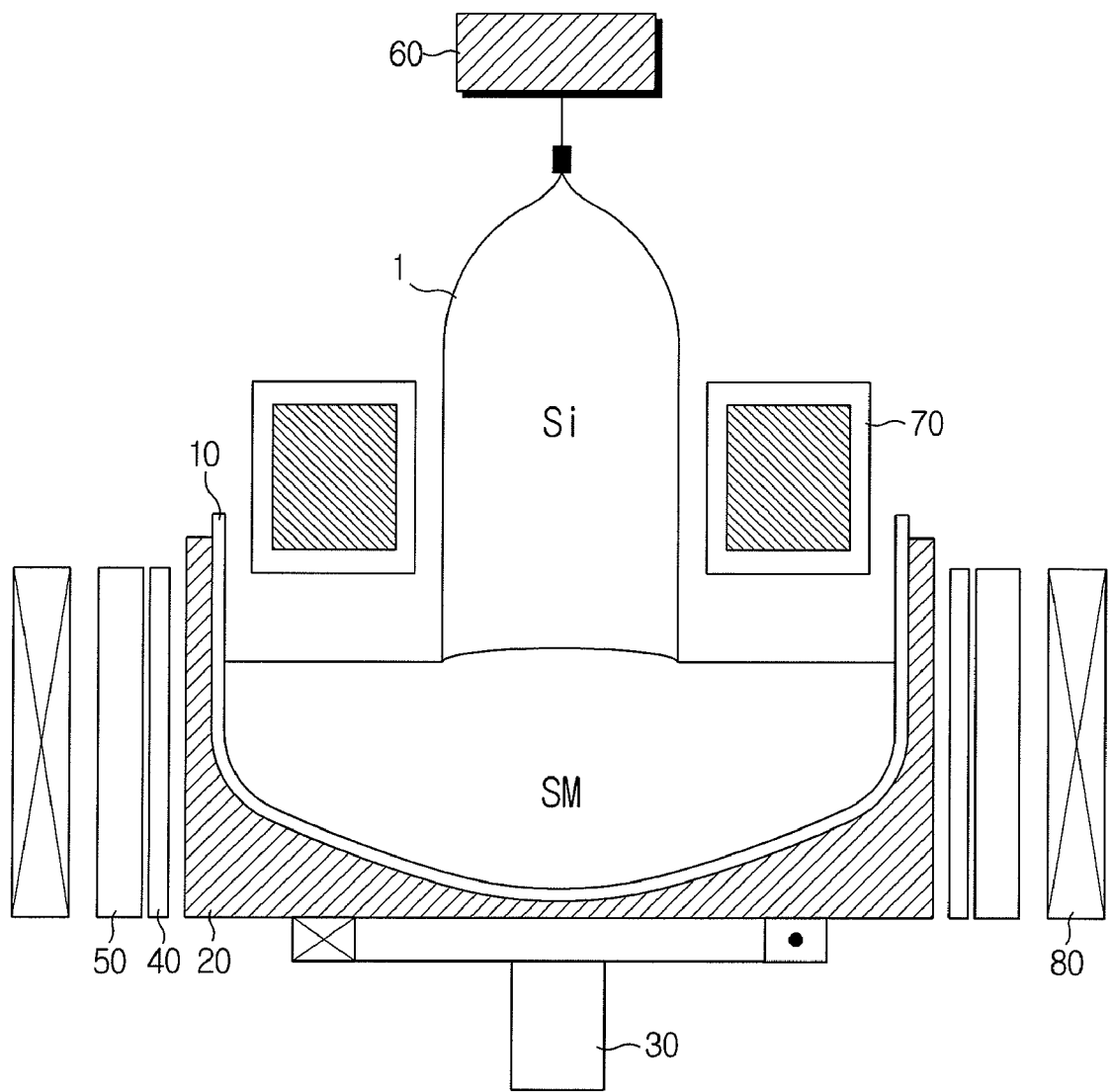
FIG. 3 is a schematic configuration diagram of a semiconductor single crystal growth apparatus according to the present invention.

FIG. 3 is a schematic configuration diagram of a semiconductor single crystal growth apparatus according to the present invention.

Referring to FIG. 3, the semiconductor single crystal growth apparatus includes a quartz crucible 10 for receiving a silicon melt (SM) melted from a poly-silicon at a high temperature; a crucible support 20 surrounding an outer periphery of the quartz crucible 10 for supporting the quartz crucible 10 with a predetermined shape at a high atmosphere; a crucible rotating means 30 installed under the crucible supporter 20 for rotating the quartz crucible 10 together with the crucible supporter 20; a heater 40 spaced apart with a predetermined distance from the wall of the crucible supporter 20 for heating the quartz crucible 10; an adiabatic means 50 installed around the heater 40 for preventing heat generated from the heater 40 from emitting outwards; a single crystal pulling means 60 for pulling up a silicon single crystal 1 from the silicon melt (SM) received in the quartz crucible 10 using a seed crystal that rotates in a predetermined direction; a heat shield structure 70 spaced apart with a predetermined distance from an outer periphery of the silicon single crystal 1 pulled by the single crystal pulling means 60 for shielding heat emitted from the silicon single crystal 1; an inert gas providing means (not shown) for providing an inert gas (for example, Ar gas) to an upper surface of the silicon melt (SM) along the outer periphery of the silicon single crystal 1; and a magnetic field applying means having a coil assembly 80 for generating a strong horizontal magnetic field in the quartz crucible 10. The components of the apparatus for growing a semiconductor single crystal correspond to typical components of a semiconductor single crystal growth apparatus using a Czochralski process, known well in the art, and their detailed description is herein omitted.

The present invention controls the crucible rotating means 30 of the growth apparatus to grow the silicon single crystal 1 while rotating the quartz crucible 10 with a rate between 0.6 rpm and 1.5 rpm. When the crucible rotating means 30 is controlled to gradually increase a rotation rate of the quartz crucible 10 in the above-mentioned range, the width of change in oxygen concentration can be minimized according to growth length of a single crystal.

Figure 4:
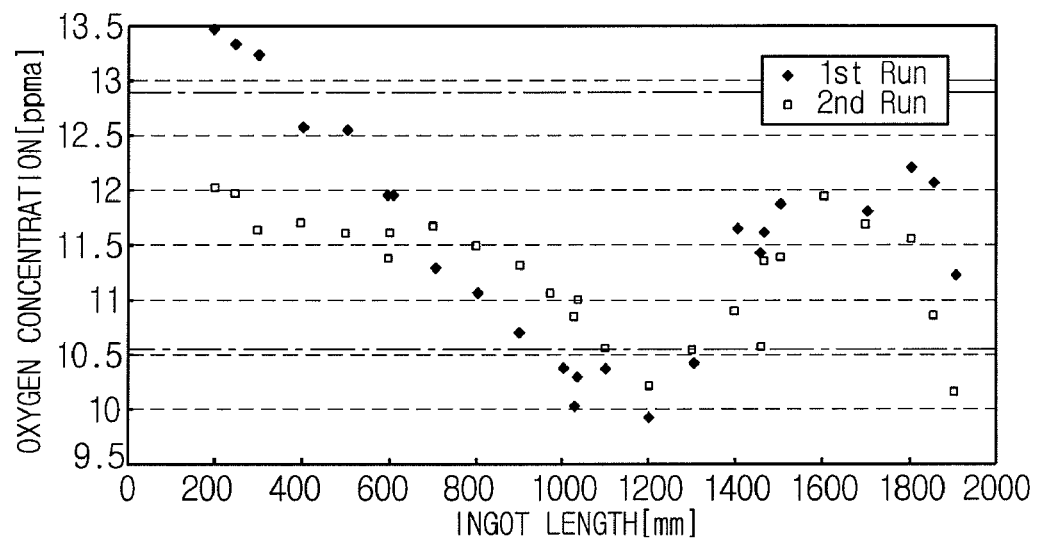
FIG. 4 is a graph of oxygen concentration profile variable according to crucible rotation rate.

FIG. 4 is a graph of oxygen concentration profile according to ingot length during growth of a silicon single crystal of about 12 inch (300 mm) diameter using two types of rotation rate ranges of the quartz crucible 10. In FIG. 4, 1st Run displays an oxygen concentration profile when a crucible rotation rate is set between 1 rpm and 1.2 rpm, and 2nd Run displays an oxygen concentration profile when a crucible rotation rate is set between 0.7 rpm and 1.2 rpm.

As mentioned above, a resonance phenomenon occurs when a crucible rotation rate is about 0.3 rpm, and a little resonance phenomenon occurs when a crucible rotation rate is about 0.5 rpm. And, in the case that a crucible rotation rate is excessively high, oxygen concentration increases excessively. In consideration of the above-mentioned matters, the present invention designed a crucible rotation rate in the range between 0.6 rpm and 1.5 rpm. In particular, if a crucible rotation rate is increased by 1 rpm or more from an initial stage of a body corresponding to ingot length of about 400 mm, oxygen concentration is increased excessively as shown in 1st Run. Thus, it is preferable to maintain a crucible rotation rate in the range between 0.6 rpm and 0.8 rpm at an initial stage of a body of an ingot. By application of the above-mentioned crucible rotation rate, oxygen concentration ranges between 10.6 rpm and 12.8 rpm (indicated by a one-dotted chain line in FIG. 4), and a high-quality silicon single crystal of 12 inch diameter or more having small distribution can be manufactured.

Figure 5:
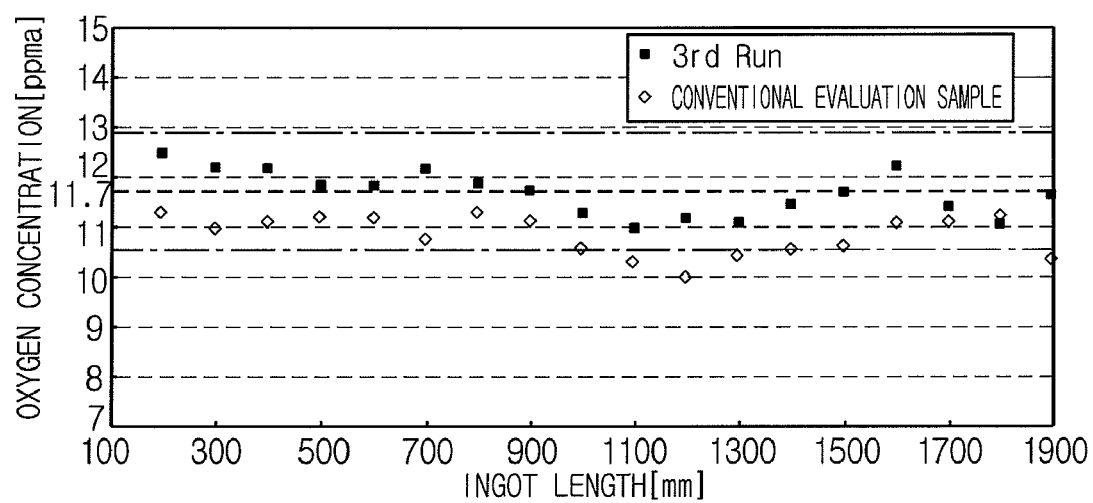
FIG. 5 is a graph showing the results of application of a crucible rotation rate according to a preferred embodiment of the present invention and the conventional art.

More preferably, the present invention designs a crucible rotation rate in the range between 0.7 rpm and 1.3 rpm to compensate for reduction of oxygen concentration in the ingot length between 900 mm and 1300 mm as shown in 3rd Run of FIG. 5, and to manufacture a silicon single crystal of higher quality having oxygen concentration between 11 ppma and 12.4 ppma than the conventional art.

Figure 6:
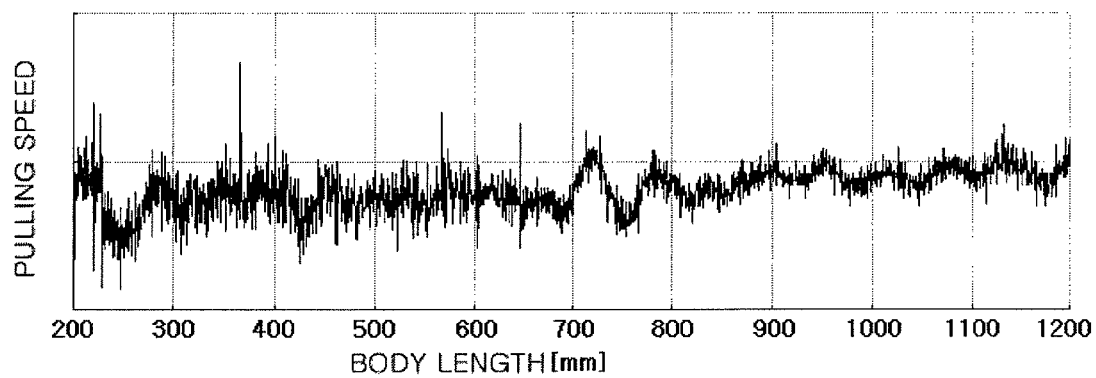
FIG. 6 is a graph of a pulling speed profile by application of a crucible rotation rate according to a preferred embodiment of the present invention.

In the case that a crucible rotation rate is in the range between 0.6 rpm and 1.5 rpm as mentioned above, the width of change in pulling speed is remarkably decreased as shown in FIG. 6 to ensure process stability, for example, to reduce the change in heater power.

Figure 7:
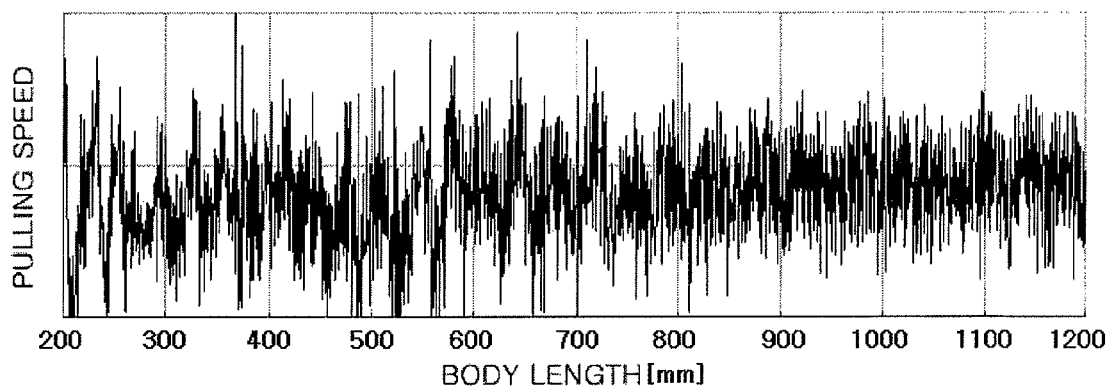
FIG. 7 is a graph of a pulling speed profile by application of a crucible rotation rate according to the conventional art.

On the contrary, in the case that a crucible rotation rate is in the range between 0.1 rpm and 0.5 rpm according to the conventional art, a low oxygen melt and a high oxygen melt interfere with each other, which results in a large width of change in pulling speed as shown in FIG. 7.

Therefore, the present invention avoids a resonance phenomenon under the conditions of a strong horizontal magnetic field, and can grow a high-quality silicon single crystal of 12 inch diameter or more having oxygen concentration between 10.6 ppma and 12.8 ppma and a small distribution. The present invention is advantageous for growth of a silicon single crystal having oxygen concentration of about 11.7 ppma suitable for an NAND flash device.

And, the present invention reduces the width of change in pulling speed of a single crystal to stably and easily perform a semiconductor single crystal growth process.

Hereinabove, preferred embodiments of the present invention has been described in detail with reference to the accompanying drawings. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A semiconductor single crystal growth method, which uses a Czochralski process for growing a semiconductor single crystal through a solid-liquid interface by dipping a seed into a semiconductor melt received in a quartz crucible and pulling up the seed while rotating the quartz crucible and applying a strong horizontal magnetic field,
wherein the seed is pulled up while the quartz crucible is rotated at a rate between 0.6 rpm and 1.5 rpm and
wherein the quartz crucible is rotated at a rate between 0.6 rpm and 0.8 rpm at an initial stage of a body of the semiconductor single crystal to grow a single crystal with an oxygen concentration between 10.6 ppma and 12.8 ppma.

2. The semiconductor single crystal growth method according to claim 1,
wherein a rotation rate of the quartz crucible is gradually increased to minimize a width of change in oxygen concentration according to single crystal growth length.

3. The semiconductor single crystal growth method according to claim 1,
wherein the strong horizontal magnetic field is applied with an intensity of 2000 G or more.

4. The semiconductor single crystal growth method according to claim 3,
wherein the strong horizontal magnetic field is applied with an intensity between 2500 G and 3500 G.

* * * * *